US009443967B1

(12) United States Patent
Chan et al.

(10) Patent No.: US 9,443,967 B1
(45) Date of Patent: Sep. 13, 2016

(54) SEMICONDUCTOR DEVICE HAVING METAL LAYER AND METHOD OF FABRICATING SAME

(71) Applicant: Macronix International Co., Ltd., Hsinchu (TW)

(72) Inventors: Ching-Lin Chan, Huwei Township (TW); Cheng-Chi Lin, Toucheng Township (TW); Yu-Chin Chien, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/657,517

(22) Filed: Mar. 13, 2015

(51) Int. Cl.
| | |
|---|---|
| *H01L 29/73* | (2006.01) |
| *H01L 29/739* | (2006.01) |
| *H01L 29/10* | (2006.01) |
| *H01L 29/06* | (2006.01) |
| *H01L 29/66* | (2006.01) |
| *H01L 29/78* | (2006.01) |

(52) U.S. Cl.
CPC ....... *H01L 29/7393* (2013.01); *H01L 29/0642* (2013.01); *H01L 29/0696* (2013.01); *H01L 29/1095* (2013.01); *H01L 29/66325* (2013.01); *H01L 29/66681* (2013.01); *H01L 29/7816* (2013.01)

(58) Field of Classification Search
CPC ........... H01L 29/7394; H01L 29/7393; H01L 29/0696; H01L 29/7398; H01L 27/11; H01L 27/1104
USPC ......................................................... 257/141
See application file for complete search history.

(56) References Cited

U.S. PATENT DOCUMENTS

| | | | | |
|---|---|---|---|---|
| 2003/0067034 | A1* | 4/2003 | Tsukanov | H01L 29/0696 257/328 |
| 2013/0161689 | A1* | 6/2013 | Huo | H01L 29/66325 257/141 |

* cited by examiner

*Primary Examiner* — Monica D Harrison
(74) *Attorney, Agent, or Firm* — Finnegan, Henderson, Farabow, Garrett & Dunner LLP

(57) ABSTRACT

A semiconductor device includes a substrate having a first conductivity type, a high-voltage well having a second conductivity type and formed in the substrate, a source well having the first conductivity type and formed in the high-voltage well, a source region formed in the source well, an isolation layer formed above the high-voltage well and spaced apart from the source well, a gate layer formed above the substrate and continuously extending from above an edge portion of the source well to an edge portion of the isolation layer, and a metal layer formed above the substrate and the isolation layer. The metal layer includes a first metal portion overlapping an edge portion of the gate layer and a side portion of the isolation layer, a second metal portion overlapping and conductively contacting the gate layer, and a third metal portion overlapping and conductively contacting the source region.

16 Claims, 18 Drawing Sheets

SEMICONDUCTOR DEVICE HAVING METAL LAYER AND METHOD OF FABRICATING SAME

FIELD OF THE DISCLOSURE

The present disclosure relates to a semiconductor device and a method of fabricating the same and, more particularly, to a semiconductor device having a metal layer and a method of fabricating the same

BACKGROUND

Ultra-high voltage (ultra-HV) semiconductor devices are widely used in display devices, portable devices, and many other applications. Design goals of the ultra-high voltage semiconductor devices include high breakdown voltage, low specific on-resistance, and high reliability in both room temperature and high temperature environments. However, as the dimensions of ultra-high voltage semiconductor devices scale down, it becomes challenging to achieve these design goals.

SUMMARY

According to an embodiment of the disclosure, a semiconductor device includes a substrate having a first conductivity type, a high-voltage well having a second conductivity type and formed in the substrate, a source well having the first conductivity type and formed in the high-voltage well, a source region formed in the source well, an isolation layer formed above the high-voltage well and spaced apart from the source well, a gate layer formed above the substrate and continuously extending from above an edge portion of the source well to an edge portion of the isolation layer, and a metal layer formed above the substrate and the isolation layer. The metal layer includes a first metal portion overlapping an edge portion of the gate layer and a side portion of the isolation layer, a second metal portion overlapping and conductively contacting the gate layer, and a third metal portion overlapping and conductively contacting the source region.

According to another embodiment of the disclosure, a method for fabricating a semiconductor device is provided. The method includes providing a substrate having a first conductivity type, forming a high-voltage well having a second conductivity type in the substrate, forming a source well having the first conductivity type in the high-voltage well, forming a source region in the source well, forming an isolation layer above the high-voltage well and spaced apart from the source well, forming a gate layer above the substrate and continuously extending from above an edge portion of the source well to an edge portion of the isolation layer, and forming a metal layer above the substrate and the isolation layer. The metal layer includes a first metal portion overlapping an edge portion of the gate layer and a side portion of the isolation layer, a second metal portion overlapping and conductively contacting the gate layer, and third metal portion overlapping and conductively contacting the source region.

The accompanying drawings, which are incorporated in and constitute a part of this specification, illustrate disclosed embodiments and, together with the description, serve to explain the disclosed embodiments.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Figure 1:
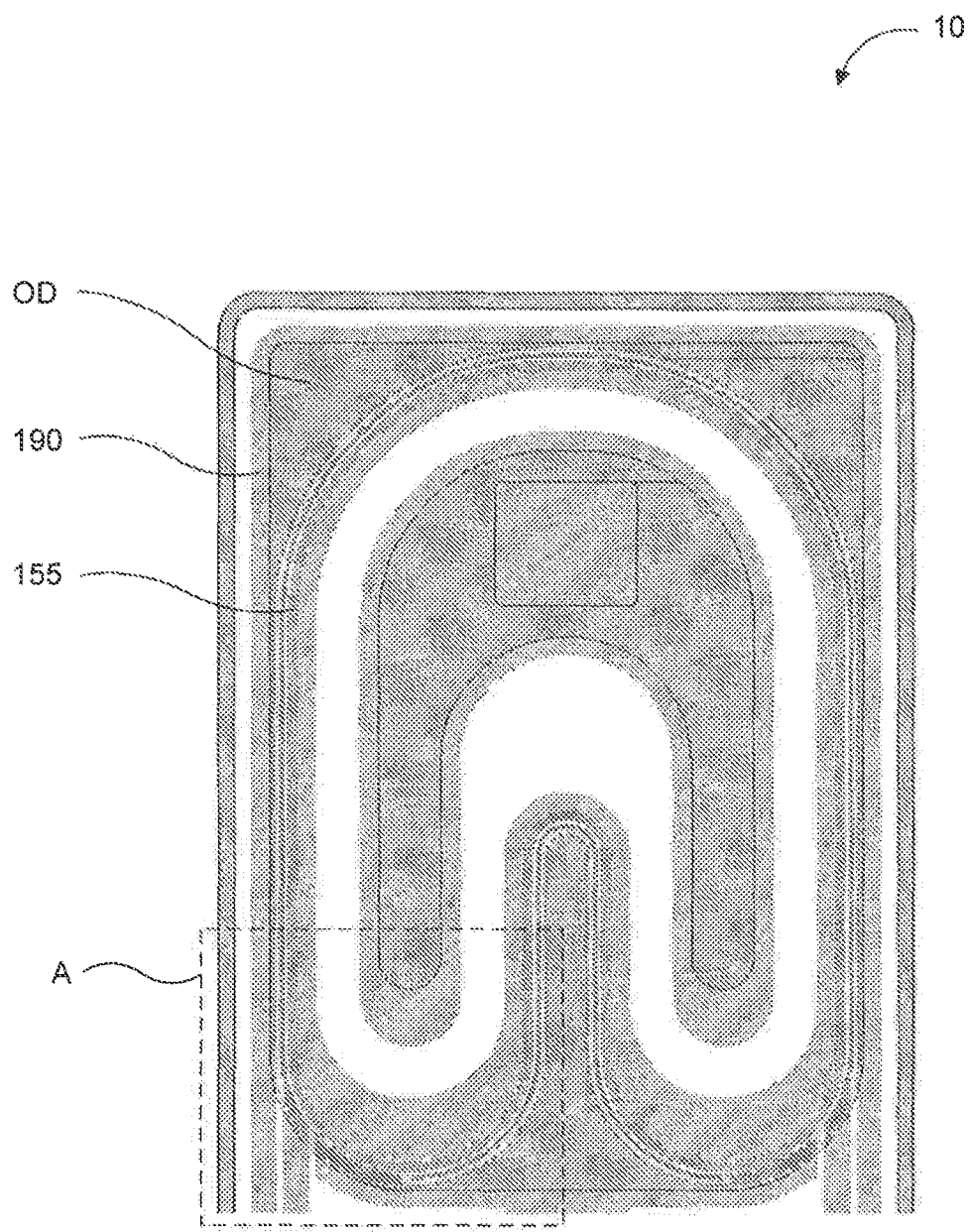
FIG. 1 is a top view of a semiconductor device, according to a comparative example.
Figure 2:
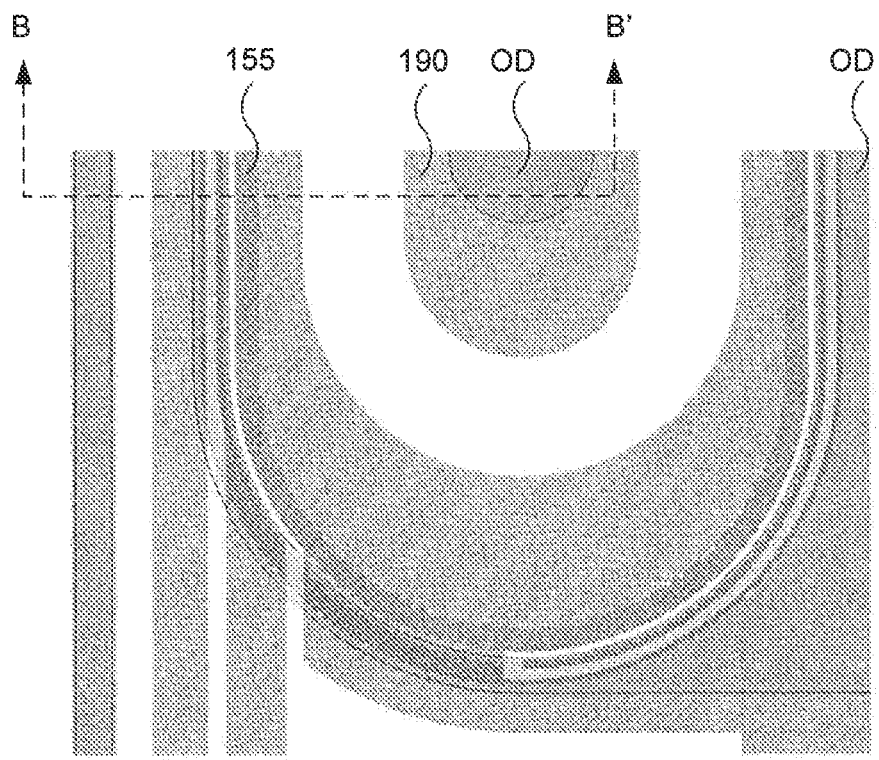
FIG. 2 is an enlarged top view of region A of the semiconductor device of FIG. 1.
Figure 3:
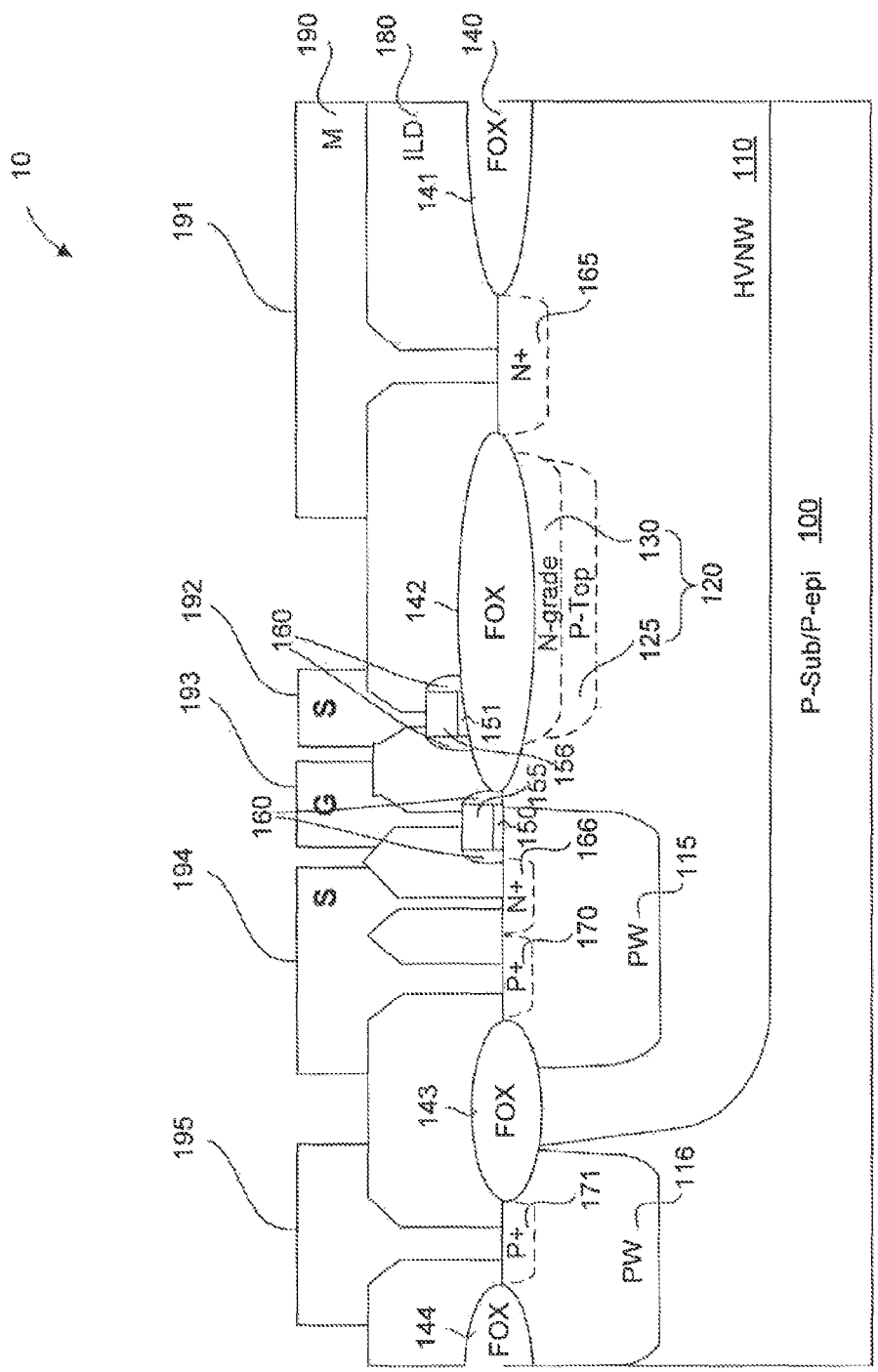
FIG. 3 is a cross-sectional view of the semiconductor device of FIG. 1, along section line B-B' of FIG. 2.

FIGS. 1-3 illustrate a semiconductor device 10, according to a comparative example. FIG. 1 is a top view of device 10, illustrating only a polysilicon layer, a metal layer, and oxide defined (OD) areas where no field oxide layer is formed. FIG. 2 is an enlarged top view of region A of device 10. FIG. 3 is a cross-sectional view of device 10, along section line B-B' of FIG. 2.

Referring to FIGS. 1-3, device 10 includes a P-type substrate (P-sub/P-epi) 100, and a high-voltage N-well (HVNW) 110 formed in substrate 100. Substrate 100 can be formed of a P-type bulk silicon material, a P-type epitaxial layer, or a P-type silicon-on-insulator (SOI) material. A first P-well (PW) 115 is formed in HVNW 110 and spaced apart from a left-side edge of HVNW 110. First PW 115 constitutes a source well of device 10. A second PW 116 is formed outside of and adjacent to the left-side edge of HVNW 110. Second PW 116 constitutes a bulk well of device 10. A drift region 120 is formed in HVNW 110 and spaced apart from a right-side edge of first PW 115. Drift region 120 includes a P-top region 125 and an N-grade region 130 formed above P-top region 125. A field oxide (FOX) layer 140 is formed above substrate 100. FOX layer 140 includes a first FOX portion 141 overlapping a right portion of HVNW 110, a second FOX portion 142 overlapping drift region 120, a third FOX portion 143 overlapping a left-side edge portion of HVNW 110 between first PW 115 and second PW 116, and a fourth FOX portion 144 overlapping a left-side edge portion of second PW 116. A first gate oxide layer 150 is formed above substrate 100 and overlaps a right-side edge portion of first PW 115. A second gate oxide layer 151 is formed above substrate 100 and overlaps a left-side portion of second FOX portion 142. A first gate layer 155 is formed above first gate oxide layer 150 and overlaps the right-side edge portion of first PW 115. A second gate layer 156 is formed above second gate oxide layer 151 and overlaps the left-side portion of second FOX portion 142. Spacers 160 are formed on side walls of first and second gate layers 155 and 156. A first $N^+$-region 165 is formed in HVNW 110 and spaced apart from a right-side edge of drift region 120. First $N^+$-region 165 constitutes a drain region of device 10. A second $N^+$-region 166 is formed in first PW 115 adjacent to a left-side edge of gate layer 155. A first $P^+$-region 170 is formed in first PW 115 and adjacent to a left-side edge of second N+-region 166. Second N+-region 166 and first P+-region 170 together constitute a source region of device 10. A second P+-region 171 is formed in second PW 116 and constitutes a contact region for making conductive contact to second PW 116 (i.e., bulk well) of device 10.

An interlayer dielectric (ILD) layer 180 is formed above substrate 100. A contact layer 190 provided, for example, as a metal layer (M), is formed above ILD layer 180. Contact layer 190 includes first through fifth contact portions 191-195 isolated from each other and conductively contacting different portions of the structures formed in substrate 100 via different openings formed in ILD layer 180. Specifically, first contact portion 191 overlaps first N+-region 165 and conductively contacts first N+-region 165. Second contact portion 192 overlaps second gate layer 156 and conductively contacts second gate layer 156. Third contact portion 193 overlaps first gate layer 155 and conductively contacts first gate layer 155. Fourth contact portion 194 overlaps first PW 115 and conductively contacts second N+-region 166 and first P+-region 170. Fifth contact portion 195 overlaps second PW 116 and conductively contacts second P+-region 171. Second contact portion 192 and fourth contact portion 194 are connectable to receive a source voltage.

Figure 4:
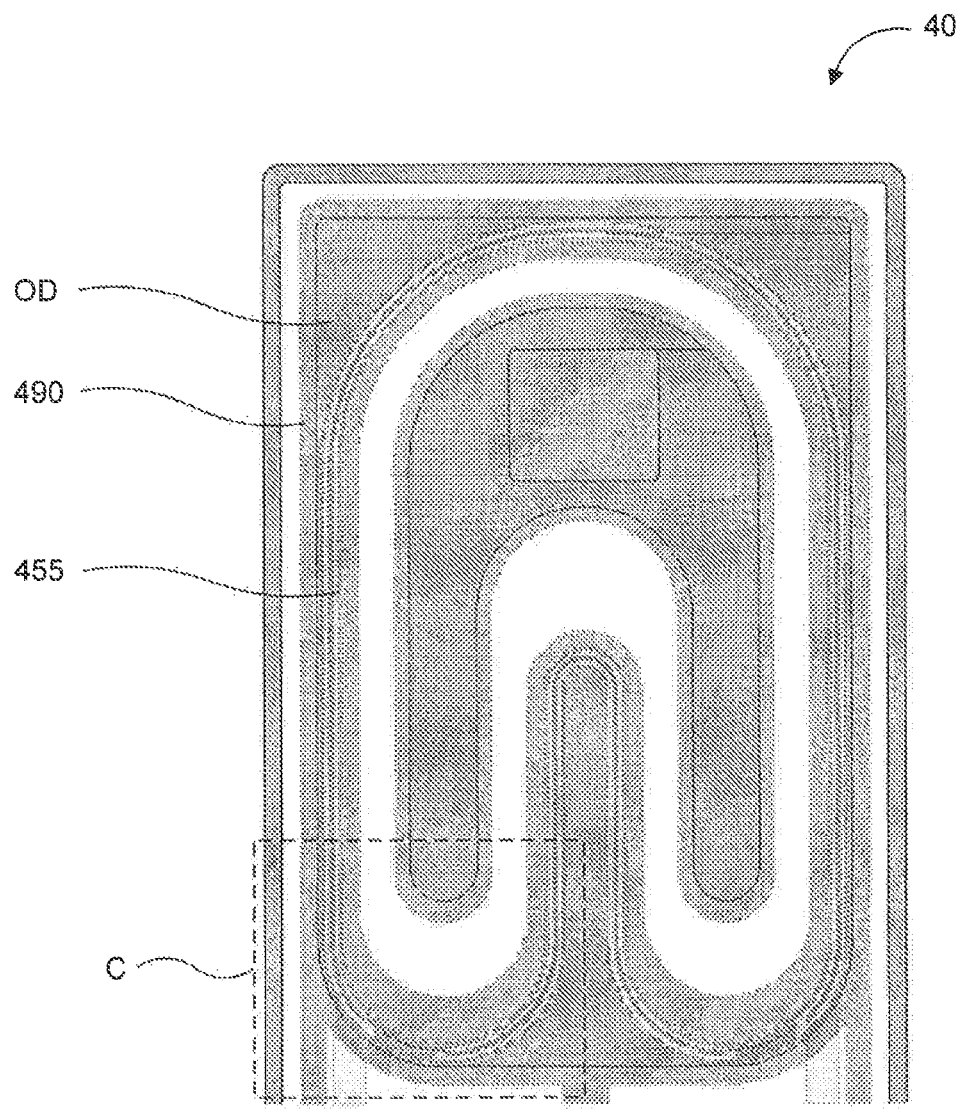
FIG. 4 is a top view of a semiconductor device, according to an illustrated embodiment of the disclosure.
Figure 5:
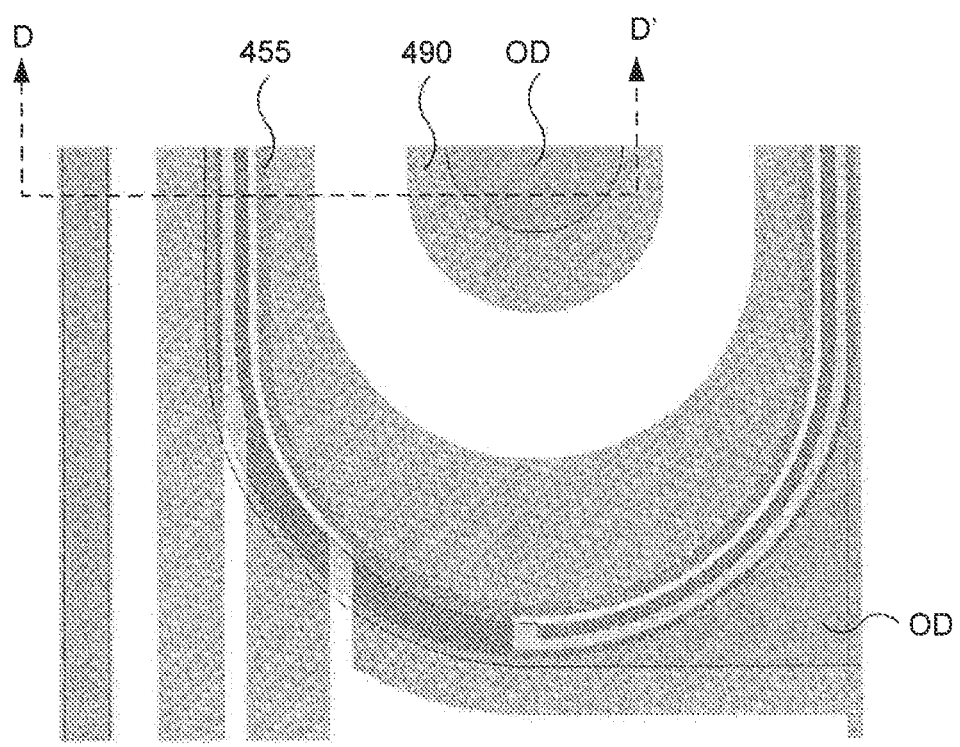
FIG. 5 is an enlarged top view of region C of the semiconductor device of FIG. 4.
Figure 6:
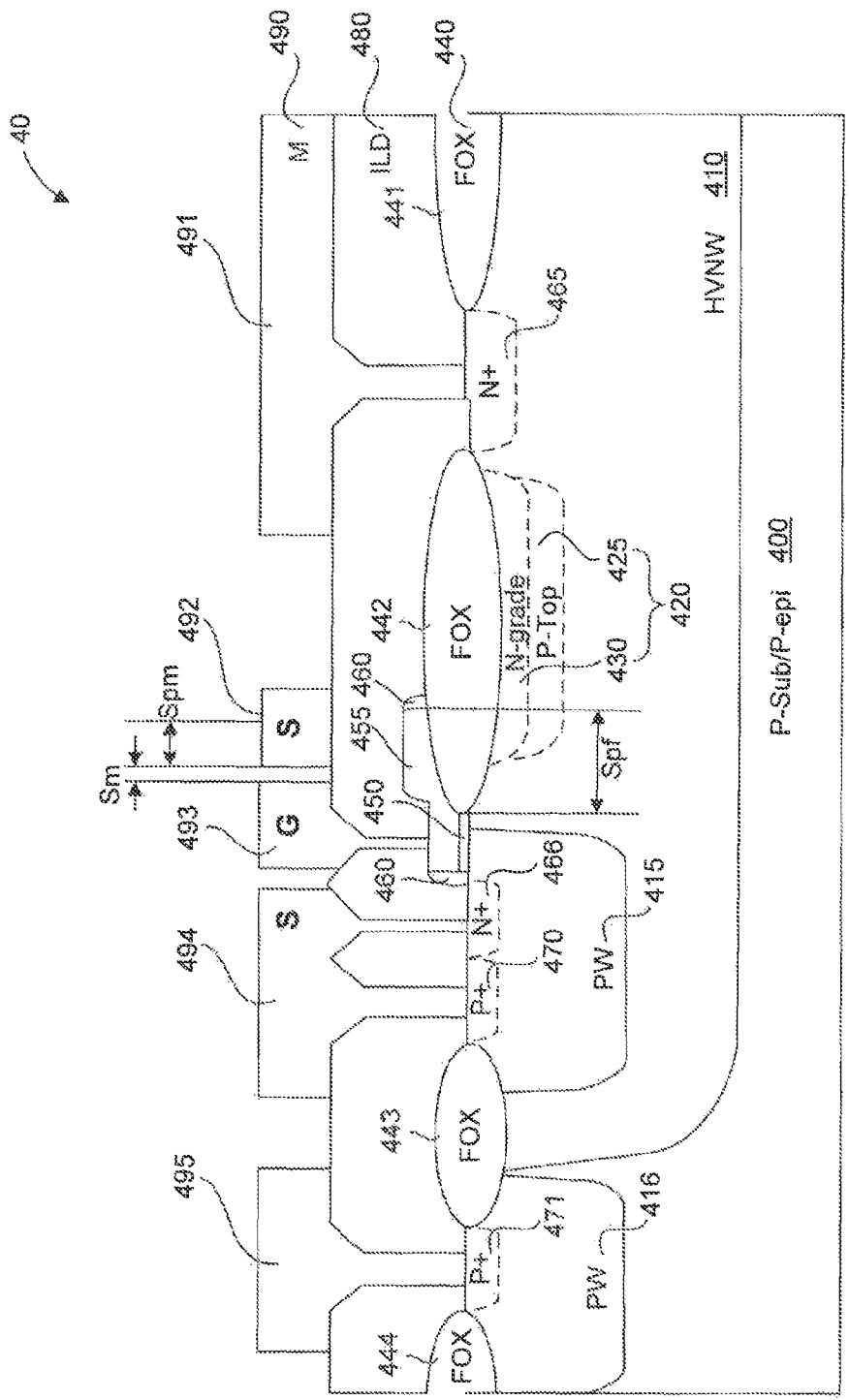
FIG. 6 is a cross-sectional view of the semiconductor device of FIG. 4, along section line D-D' of FIG. 5.

FIGS. 4-6 illustrate a semiconductor device 40, according to an illustrated embodiment. FIG. 4 is a top view of device 40, illustrating only a polysilicon layer, a metal layer, and oxide defined (OD) areas where no field oxide layer is formed. FIG. 5 is an enlarged top view of region C of device 40 illustrated in FIG. 4. FIG. 6 is a cross-sectional view of device 40, along section line D-D' of FIG. 5.

Device 40 is an N-type lateral diffused metal oxide semiconductor (LDMOS) device that is configured to accommodate high-voltage operation (e.g., 40V or higher) or even ultra-high-voltage operation (e.g., 400V or higher) relatively to other semiconductor devices. Referring to FIGS. 4-6, device 40 includes a P-type substrate (P-sub/P-epi) 400, and a high-voltage N-well (HVNW) 410 formed in substrate 400. Substrate 400 can be formed of a P-type bulk silicon material, a P-type epitaxial layer, or a P-type silicon-on-insulator (SOI) material. A first P-well (PW) 415 is formed in HVNW 410 and spaced apart from a left-side edge of HVNW 410. First PW 415 constitutes a source well of device 40. A second PW 416 is formed outside of and adjacent to the left-side edge of HVNW 410. Second PW 416 constitutes a bulk well of device 40. A drift region 420 is formed in HVNW 410 and spaced apart from a right-side edge of first PW 415. Drift region 420 includes a P-top region 425 and an N-grade region 430 formed above P-top region 425. A field oxide (FOX) layer 440 is formed above substrate 400. FOX layer 440 functions as an insulating isolation layer for device 40. FOX layer 440 includes a first FOX portion 441 overlapping a right portion of HVNW 410, a second FOX portion 442 overlapping drift region 420, a third FOX portion 443 overlapping a left-side edge portion of HVNW 410 between first PW 415 and second PW 416, and a fourth FOX portion 444 overlapping a left-side edge portion of second PW 416. A gate oxide layer 450 is formed above substrate 400 and overlaps a right-side edge portion of first PW 415. A gate layer 455 is formed above gate oxide layer 450, and overlaps the right-side edge portion of first PW 415 and a left-side edge portion of second FOX portion 442. That is, gate layer 455 continuously extends from above the right-side edge portion of first PW 415 to the left-side edge portion of second FOX portion 442. Spacers 460 are formed on side walls of gate layer 455. A first N+-region 465 is formed in HVNW 410 and spaced apart from a right-side edge of drift region 420. First N+-region 465 constitutes a drain region of device 40. A second N+-region 466 is formed in first PW 415 adjacent to a left-side edge of gate layer 455. A first P+-region 470 is formed in first PW 415 and adjacent to a left-side edge of second N+-region 466. Second N+-region 466 and first P+-region 470 together constitute a source region of device 40. A second P+-region 471 is formed in second PW 416 and constitutes a contact region for making conductive contact to second PW 416 (i.e., bulk well) of device 40.

An interlayer dielectric (ILD) layer 480 is formed above substrate 400. A contact layer 490 provided, for example, as a metal layer (M), is formed above ILD layer 480. Contact layer 490 includes first through fifth contact portions 491-495 isolated from each other for conductively contacting different portions of the structures formed in substrate 400 via different openings formed in ILD layer 480. Specifically, first contact portion 491 overlaps first N+-region 465 and conductively contacts first N+-region 465. First contact portion 491 is connectable to receive a drain voltage. Second contact portion 492 overlaps a right-side edge portion of gate layer 455 and a left-side portion of second FOX portion 442. Third contact portion 493 overlaps a left-side portion of gate layer 455 and conductively contacts gate layer 455. Third contact portion is connectable to receive a gate voltage. Fourth contact portion 494 overlaps and conductively contacts second N+-region 466 and first P+-region 470. Second contact portion 492 and fourth contact portion 494 are connectable to receive a source voltage. Fifth contact portion 495 overlaps second PW 416 and conductively contacts second P+-region 471. Additional ILD layers and contact layers can be formed above substrate 400.

Device 10 of the comparative example includes two separate gate layers 155 and 156 that respectively overlap the right-side edge portion of first PW 115 and the left-side portion of second FOX portion 142. In contrast, device 40 of the embodiment of the disclosure includes a single gate layer, i.e., gate layer 455 that continuously overlapping both of the right-side edge portion of first PW 415 and the left-side portion of second FOX portion 442.

In addition, in device 10 of the comparative example, second contact portion 192 conductively contacts second gate layer 156, which is formed under second contact portion 192, via an opening formed within ILD layer 180. In contrast, in device 40 of the embodiment of the disclosure, second contact portion 192 does not conductively contact gate layer 455.

It is noted that the components of device 40 shown in FIGS. 4-6 are not necessarily drawn to scale. For example, the overlapping space $S_{pf}$ between gate layer 455 and second FOX portion 442, the overlapping space $S_{pm}$ between gate layer 455 and second contact portion 492, and the distance $S_m$ between second contact portion 492 and third contact portion 493 can be different in scale from the distances illustrated in FIGS. 4-6.

FIGS. 7A-7L schematically illustrate a process of fabricating device 40 of FIGS. 4-6, according to an illustrated embodiment.

Figure 7A:
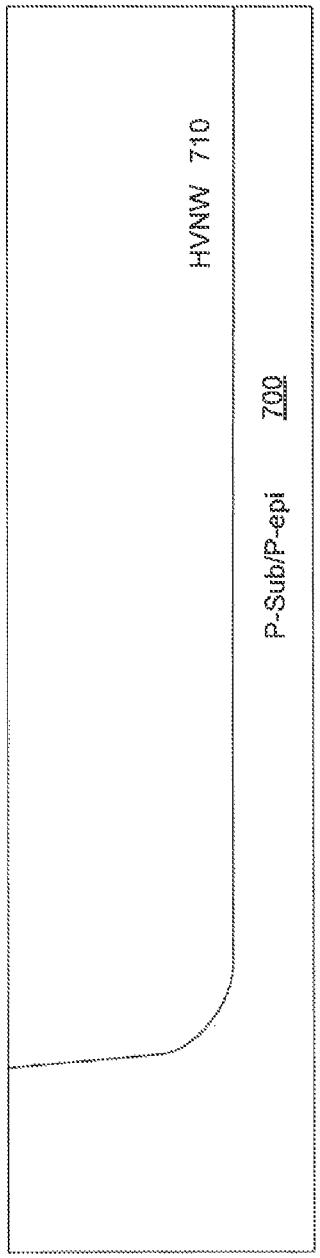
FIGS. 7A-7L schematically illustrate a process of fabricating the semiconductor device of FIGS. 4-6, according to an illustrated embodiment.

First, referring to FIG. 7A, a P-type substrate (P-sub/P-epi) 700 is provided. Substrate 700 can be formed of a P-type bulk silicon material, a P-type epitaxial layer, or a P-type silicon-on-insulator (SOI) material. A HVNW 710 is formed in substrate 200 and extends downward from a top surface of substrate 700. HVNW 710 is formed by a photolithography process that defines a region in substrate 700 in which HVNW 710 is to be formed, an ion implantation process for implanting an N-type dopant (e.g., phosphorus or arsenic) into the defined region, and a heating process for driving-in the implanted dopant.

Figure 7B:
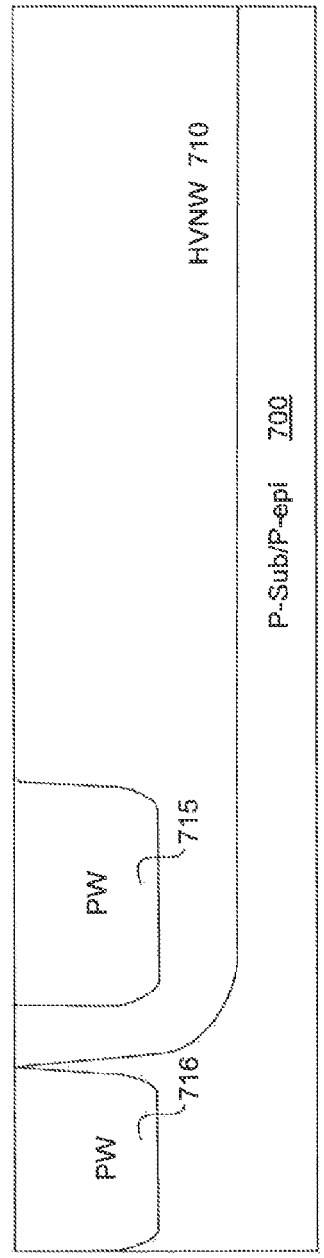

Referring to FIG. 7B, a first P-well (PW) 715 is formed in HVNW 710, close to a left-side edge portion of HVNW 710. A second PW 716 is formed in substrate 700, outside and adjacent to the edge portion of HVNW 710. First PW 715 and second PW 716 are formed by a photolithography process that defines regions in which first PW 715 and second PW 716 are to be formed, an ion implantation process for implanting a P-type dopant (e.g., boron) into the defined regions, and a heating process for driving-in the implanted dopant to reach a predetermined depth.

Figure 7C:
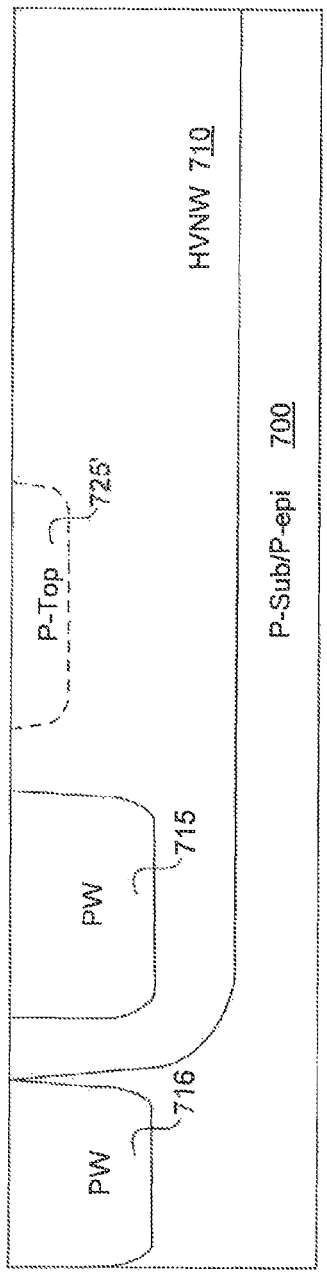

Referring to FIG. 7C, a P-top implantation region 725' is formed in HVNW 710, extending downward from a top surface of HVNW 710. P-top implantation region 725' is disposed on a right side of first PW 715, and is further away from the left-side edge portion of HVNW 710 compared to first PW 715. P-top implantation region 725' is formed by a photolithography process that defines a region in which P-top implantation region 725' is to be formed, and an ion implantation process for implanting a P-type dopant (e.g., boron) into the defined region.

Figure 7D:
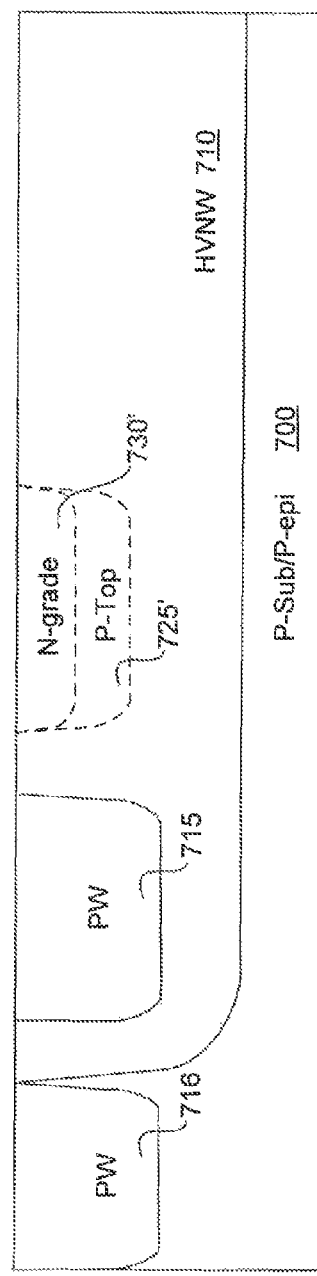

Referring to FIG. 7D, an N-grade implantation region 730' is formed in HVNW 710, extending downward from the top surface of HVNW 710, and vertically (along a thickness direction of substrate 700) aligned with P-top implantation region 725'. N-grade implantation region 730' is formed by a photolithography process that defines a region in which N-grade implantation region 730' is to be formed, and an ion implantation process for implanting an N-type dopant (e.g., phosphorus or arsenic) into the defined region. A depth of P-top implantation region 725' is larger than a depth of N-grade implantation region 730'.

Figure 7E:
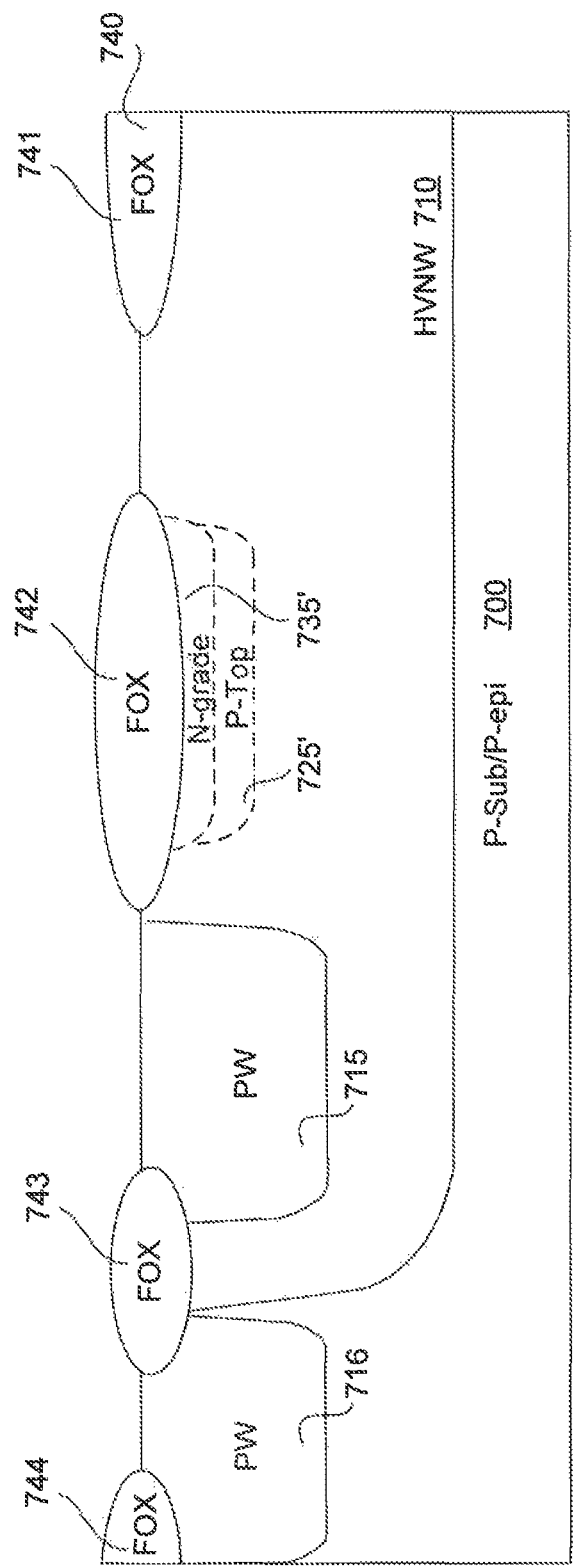

Referring to FIG. 7E, an insulating isolation layer in the form of a field oxide (FOX) layer 740 is formed above the surface of substrate 700. FOX layer 740 includes a first FOX portion 741 overlapping a right portion of HVNW 710, a second FOX portion 742 overlapping P-top implantation region 725' and N-grade implantation region 730', a third FOX portion 743 overlapping the left-side edge portion of HVNW 710 between first PW 715 and second PW 716, and a fourth FOX portion 744 overlapping a left-side edge portion of second PW 716. FOX layer 740 is formed by a deposition process that deposits, e.g., a silicon nitride layer, a photolithography process that defines regions where FOX layer 740 is to be formed, an etching process that removes the silicon nitride layer in the defined regions, and a thermal oxidation process that forms FOX layer 240 in the defined regions. During the thermal oxidation process for forming FOX layer 240, the P-type dopant in P-top implantation region 725' and the N-type dopant in N-grade implantation region 730' are driven to predetermined depths in HVNW 710 to form a P-top region 725 and an N-grade region 730, respectively. P-top region 725 and N-grade region 730 together constitute a drift region 720.

Figure 7F:
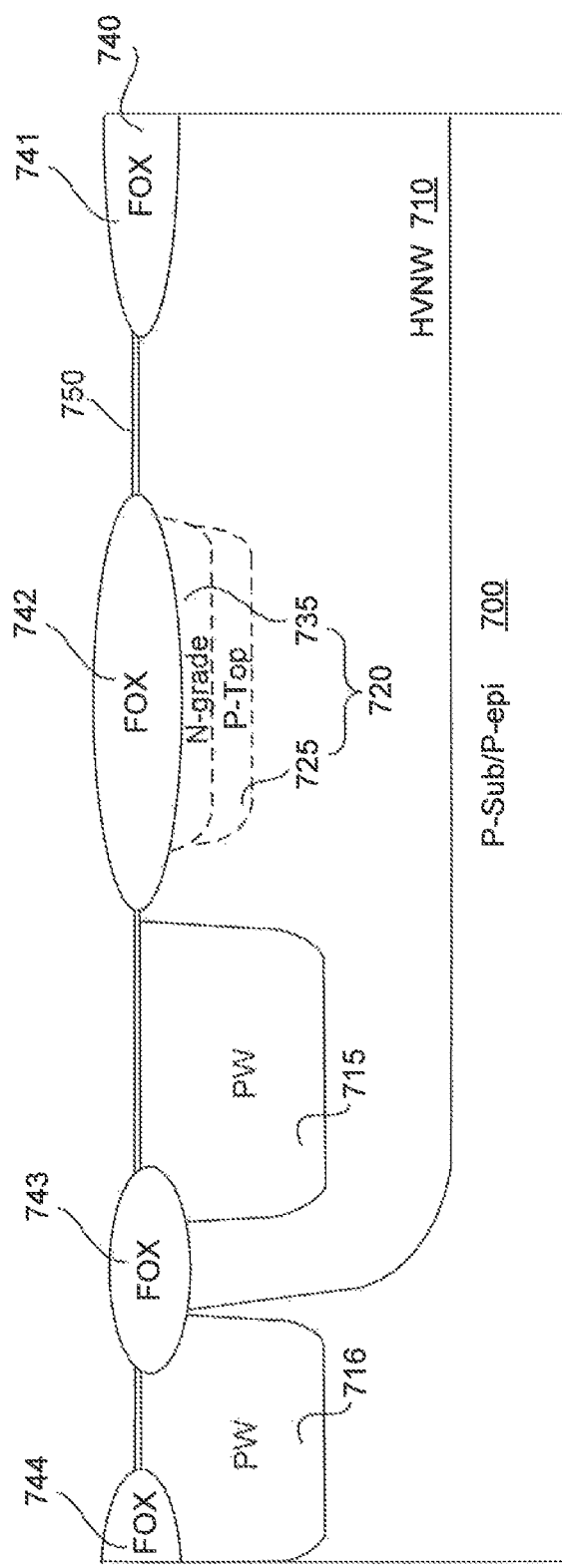

Referring to FIG. 7F, a gate oxide layer 750 is formed above surface portions of the structure of FIG. 7E. That is, gate oxide layer 750 is formed between first FOX portion 741 and second FOX portion 742, between second FOX portion 742 and third FOX portion 743, and between third FOX portion 743 and fourth FOX portion 744. Gate oxide layer 750 is formed by a sacrificial oxidation process to form a sacrificial oxide layer, a cleaning process to remove the sacrificial oxide layer, and an oxidation process to form gate oxide layer 750.

Figure 7G:
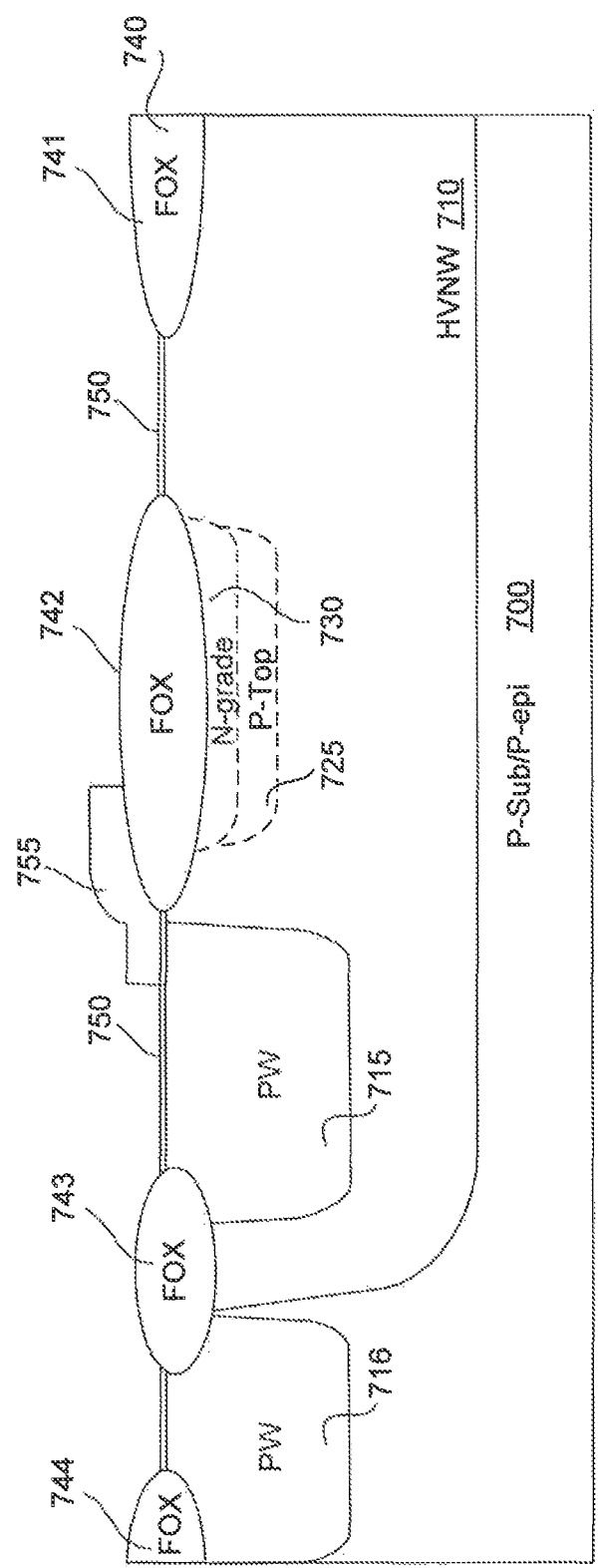

Referring to FIG. 7G, a gate layer 755 is formed above gate oxide layer 750, overlapping a left-side portion of second FOX portion 742 and a right-side portion of first PW 715. Gate layer 755 can include, e.g., a polysilicon layer and a tungsten silicide layer formed above the polysilicon layer. Gate layer 755 is formed by a deposition process for depositing a polysilicon layer and a tungsten silicide layer over the entire substrate, a photolithography process that defines a region where gate layer 755 is to be formed, and an etching process that removes the polysilicon layer and the tungsten silicide layer outside the defined region.

Figure 7H:
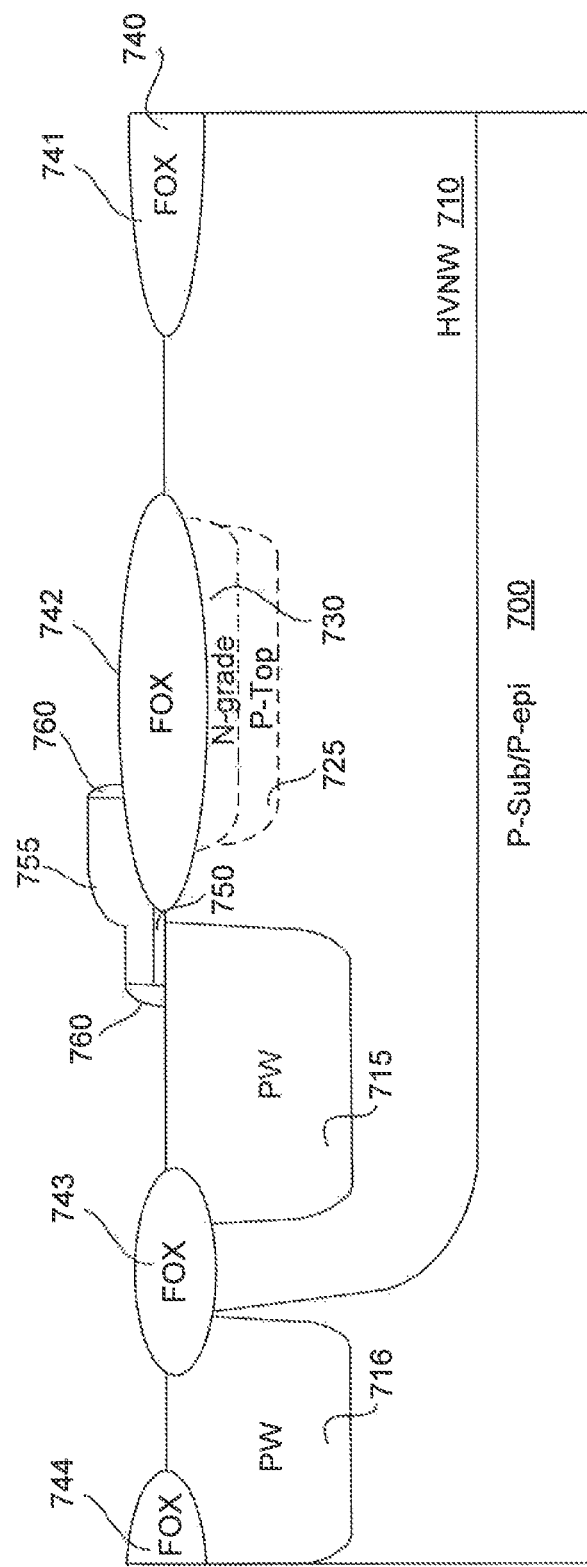

Referring to FIG. 7H, spacers 760 are formed on both sides of gate layer 755. Spacers 760 are formed of, e.g., tetraethoxysilane (TEOS) oxide films. Spacers 760 are formed by a deposition process that deposits the TEOS oxide film, a photolithography process that defines regions where spacers 760 are to be formed, and an etching process that removes the TEOS oxide film outside the defined regions. After spacers 760 are formed, gate oxide layer 750, except for the portion under gate layer 755 and spacers 760, is removed by etching.

Figure 7I:
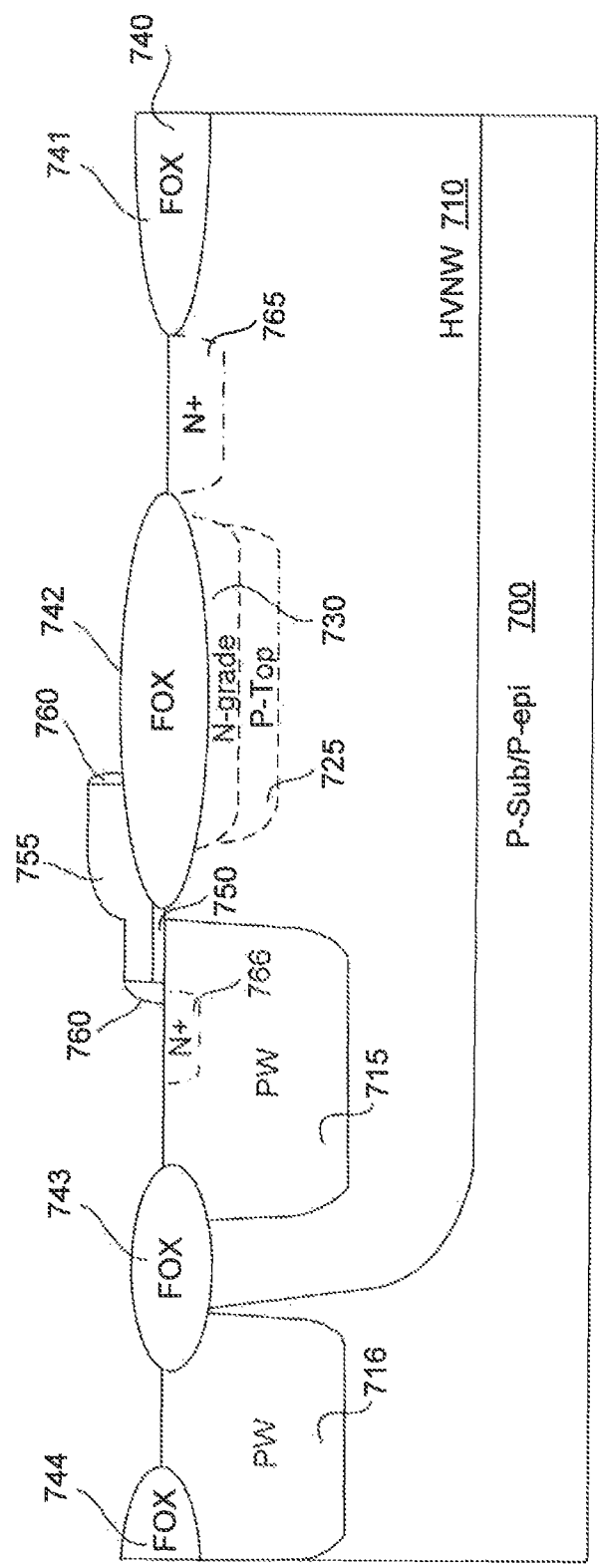

Referring to FIG. 7I, a first $N^+$-region 765 is formed in HVNW 710 between first FOX portion 741 and second FOX portion 742, and a second $N^+$-region 766 is formed in first PW 715 adjacent to a left-side edge portion of gate layer 755 and under a left-side spacer 760. First $N^+$-region 765 and second $N^+$-region 766 are formed by a photolithography process that defines regions where first $N^+$-region 765 and second $N^+$-region 766 are to be formed, and an ion implantation process for implanting a N-type dopant (e.g., phosphorus or arsenic) into the defined regions.

Figure 7J:
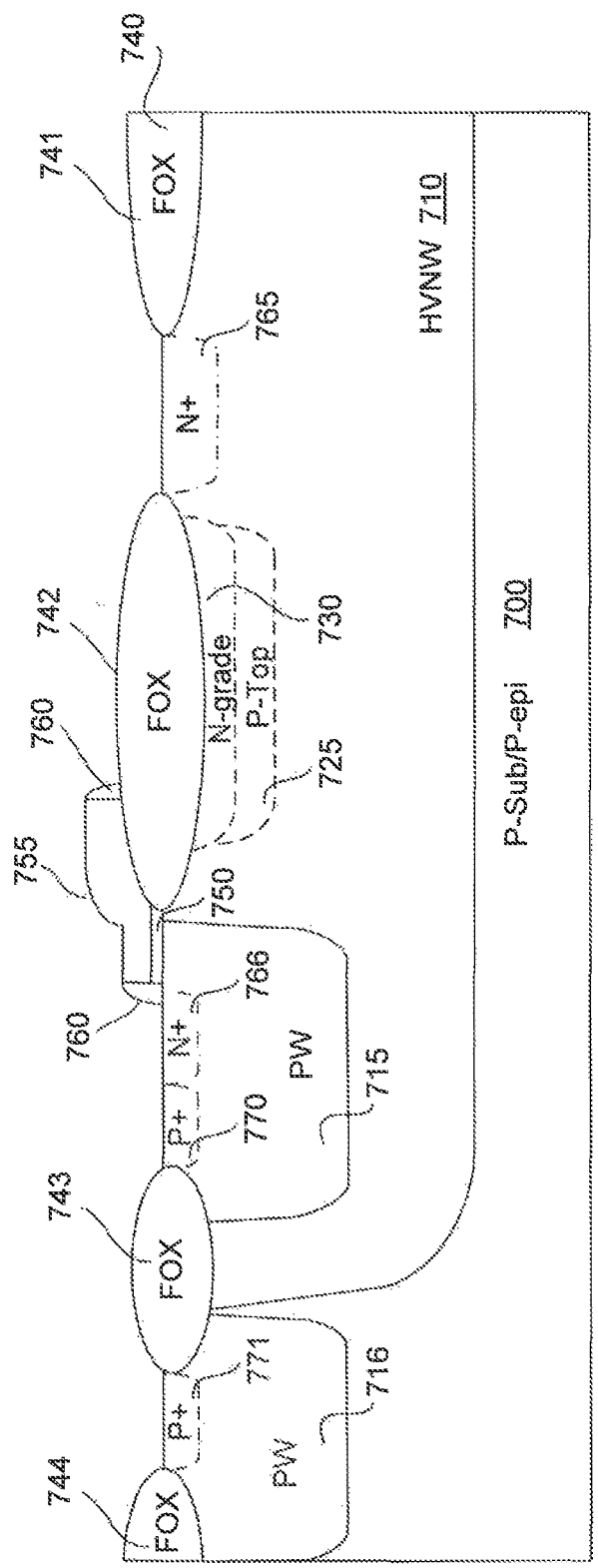

Referring to FIG. 7J, a first $P^+$-region 770 is formed in first PW 715 adjacent to second $N^+$-region 766, and a second $P^+$-region 771 is formed in second PW 716 between third FOX portion 743 and fourth FOX portion 744. First $P^+$-region 770 and second $P^+$-region 771 are formed by a photolithography process that defines regions where first $P^+$-region 770 and second $P^+$-region 771 are to be formed, and an ion implantation process for implanting a P-type dopant (e.g., boron) into the defined regions.

Figure 7K:
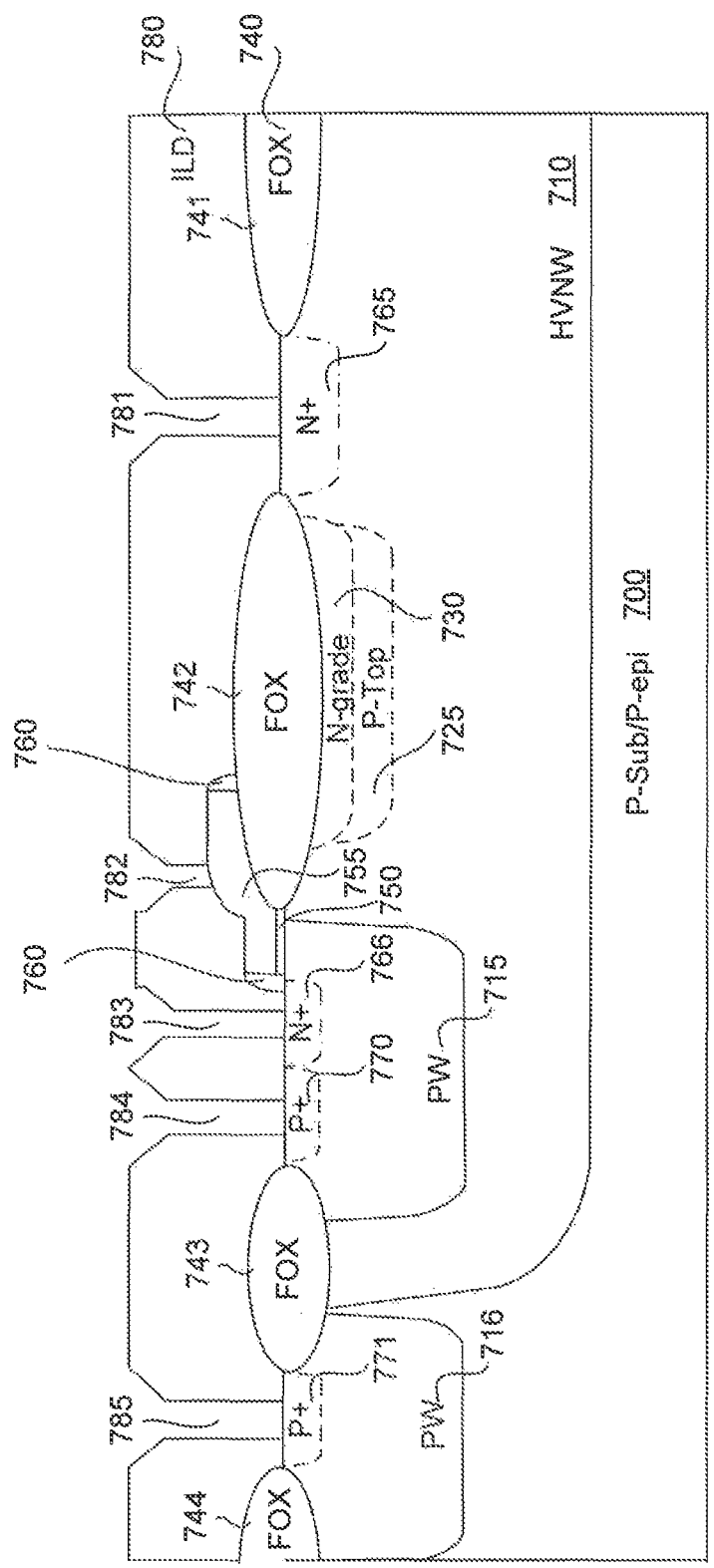

Referring to FIG. 7K, an interlayer dielectric (ILD) layer 780 is formed above the entire surface of the structure of FIG. 7J. ILD layer 780 includes a first opening 781 that is vertically aligned with first $N^+$-region 765, a second opening 782 that is vertically aligned with gate layer 755, a third opening 783 that is vertically aligned with second $N^+$-region 766, a fourth opening 784 that is vertically aligned with first $P^+$-region 770, and a fifth opening 785 that is vertically aligned with second $P^+$-region 771. ILD layer 780 can include undoped silicate glass (USG) and/or borophosphosilicate glass (BPSG). ILD layer 780 is formed by a deposition process for depositing a layer of USG and/or BPSG, a photolithography process that defines regions where ILD layer 780 is to be formed, and an etching process that removes the layer of USG and/or BPSG outside the defined regions for forming openings 781 through 785.

Figure 7L:
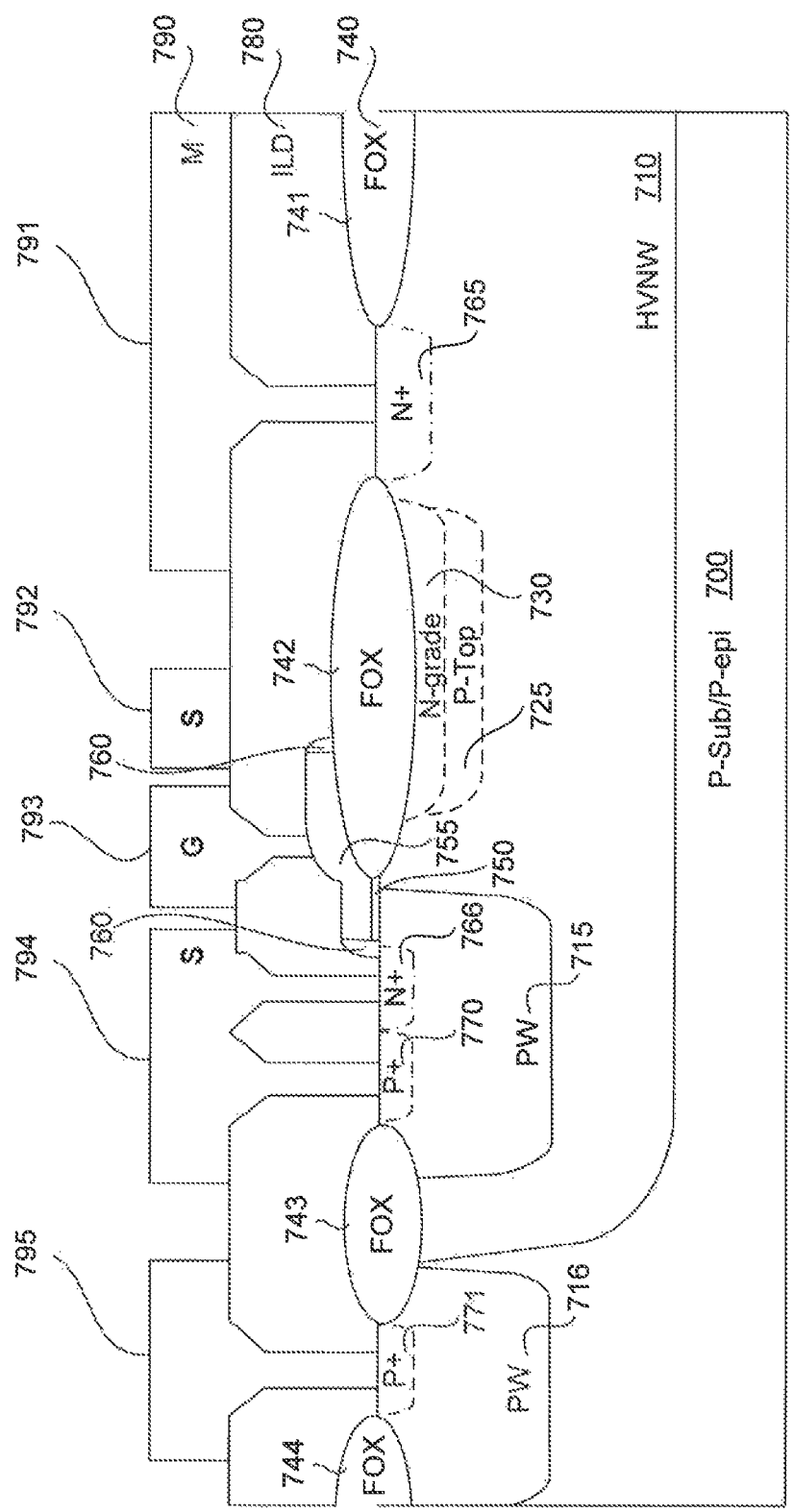

Referring to FIG. 7L, a contact layer (M) 790 is formed above the structure of FIG. 7K. Contact layer 790 includes a first contact portion 791 that overlaps and contacts first $N^+$-region 765 via opening 781, a second contact portion 792 that overlaps a right-side edge portion of gate layer 755 and a left-side portion of second FOX portion 742, a third contact portion 793 that overlaps a left-side portion of gate layer 755 and contacts gate layer 755 via opening 782, a fourth contact portion 794 that overlaps first PW 715 and contacts second $N^+$-region 766 and first $P^+$-region 770 via openings 783 and 784, respectively, and a fifth contact portion 795 that overlaps second PW 716 and contacts second $P^+$-region 771 via opening 785. Contact layer 790 can be made of any electrically conductive metal, such as aluminum, copper, or an aluminum-copper alloy. Contact layer 790 is formed by a deposition process that deposits a metal layer, a photolithography process that defines regions where contact layer 790 is to be formed, and an etching process that removes the metal layer outside the defined regions.

Figure 8:
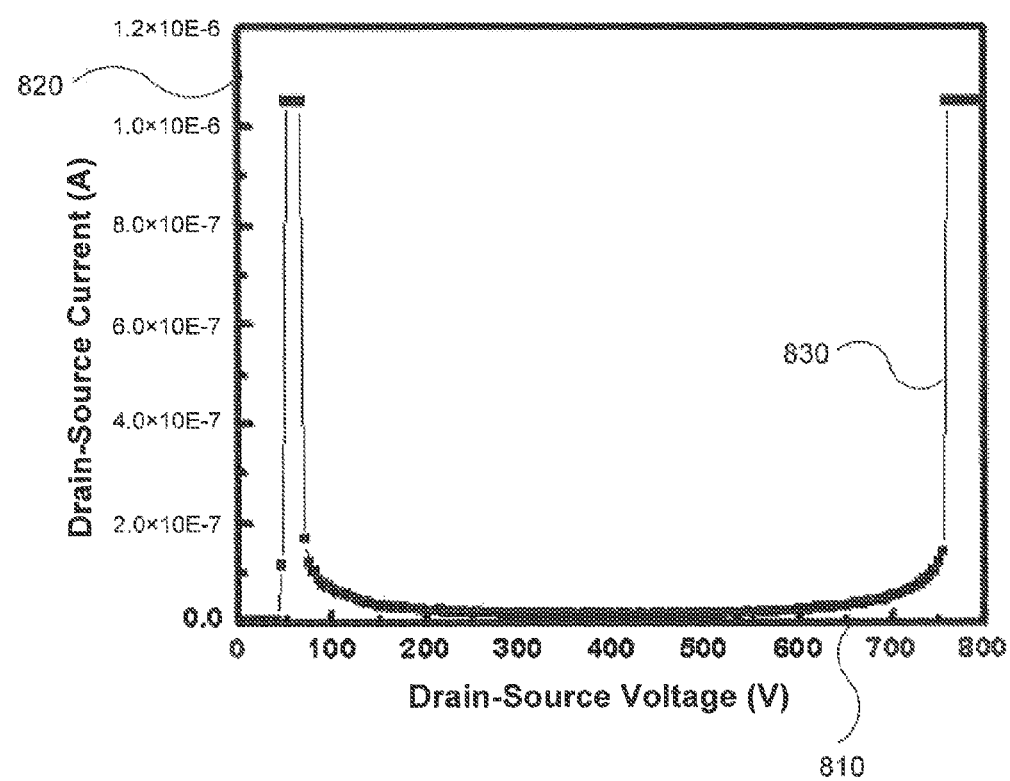
FIG. 8 is a graph showing breakdown characteristics of the semiconductor device of FIGS. 1-3.

FIG. 8 is a graph showing breakdown characteristics of device 10 as the comparative example. In the graph of FIG. 8, an abscissa 810 represents a drain-source voltage $V_{ds}$ in volts V (i.e., the voltage applied between first N⁺-region 165 as the drain region and second N⁺-region 166 and first P⁺-region 170 as the source region), and an ordinate 820 represents a drain-source current $I_{ds}$ in amperes A. Curve 830 represents the $V_{ds}$ vs. $I_{ds}$ characteristic of device 10. In FIG. 8, the drain-source voltage $V_{ds}$, denoted on abscissa 810 as "Drain-Source Voltage (V)," varies between 0 and 800V, and a gate-source voltage $V_{gs}$ (i.e., the voltage applied between gate layer 155 and second N⁺-region 166 and first P⁺-region 170 as the source region) and a bulk-source voltage $V_{bs}$ (i.e., the voltage applied between second P⁺-region 171 as the contact region for the bulk well and second N⁺-region 166 and first P⁺-region 170 as the source region) are maintained at 0V. As illustrated in FIG. 8, the drain-source current $I_{ds}$ increase abruptly to around $1.0 \times 10^6$ A when the drain-source voltage $V_{ds}$ is around 80V and when $V_{ds}$ increases above 760V.

Figure 9:
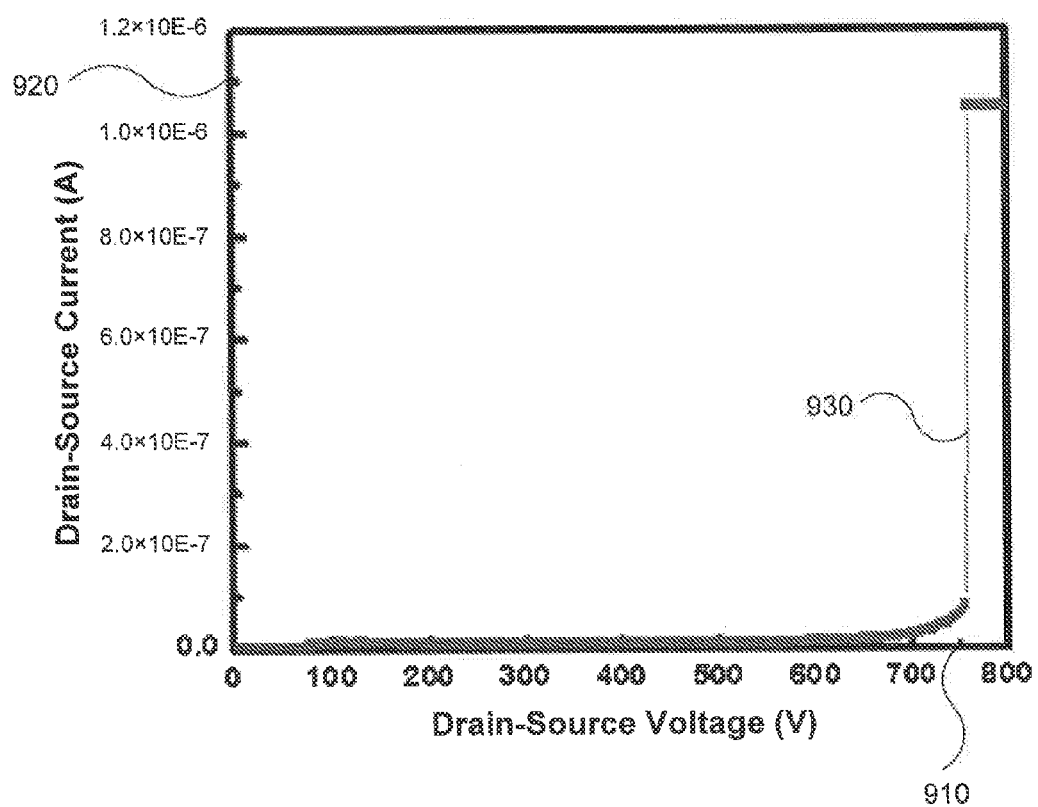
FIG. 9 is a graph showing breakdown characteristics of the semiconductor device of FIGS. 4-6.

FIG. 9 is a graph showing breakdown characteristics of device 40 according to an embodiment of the disclosure. In the graph of FIG. 9, an abscissa 910 represents a drain-source voltage $V_{ds}$ in volts V, and an ordinate 920 represents a drain-source current $I_{ds}$ in amperes A. Curve 930 represents the $V_{ds}$ VS. $I_{ds}$ characteristic of device 40. In FIG. 9, the drain-source voltage $V_{ds}$, denoted on abscissa 910 as "Drain-Source Voltage (V)," varies between 0 and 800V, and a gate-source voltage $V_{gs}$ and a bulk-source voltage $V_{bs}$ are maintained at 0V. As illustrated in FIG. 9, the drain-source current $I_{ds}$ increase above $1.0 \times 10^{-6}$ A only when the drain-source voltage Vds increases above 760V. Compared to the breakdown characteristics of device 10 illustrated in FIG. 8, the drain-source current $I_{ds}$ of device 40 does not increase abruptly when the drain-source voltage $V_{ds}$ is around 80V.

While the embodiment described above is directed to an N-type LDMOS device 40 shown in FIGS. 4-6 and fabrication methods thereof shown in FIGS. 7A-7L, those skilled in the art will now appreciate that the disclosed concepts are equally applicable to a P-type LDMOS device in which all of the elements have conductivity types opposite to those of N-type LDMOS device 40.

Those skilled in the art will also appreciate that the disclosed concepts are applicable to other semiconductor devices and the fabrication methods thereof, such as insulated-gate bipolar transistor (IGBT) devices. An IGBT device has a structure similar to that of N-type LDMOS device 40 shown in FIGS. 4-6, except that first N⁺-region 465 of device 40 is replaced with a P⁺-region as a drain region of the IGBT device.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
    a substrate having a first conductivity type;
    a high-voltage well having a second conductivity type and formed in the substrate;
    a source well having the first conductivity type and formed in the high-voltage well;
    a source region formed in the source well;
    an isolation layer formed above the high-voltage well and spaced apart from the source well;
    a gate layer formed above the substrate and continuously extending from above an edge portion of the source well to an edge portion of the isolation layer;
    a metal layer formed above the substrate and the isolation layer, the metal layer including a first metal portion overlapping an edge portion of the gate layer and a side portion of the isolation layer, a second metal portion overlapping and conductively contacting the gate layer, and a third metal portion overlapping and conductively contacting the source region; and
    a drift region formed in the high-voltage well and under the isolation layer, the drift region including:
        a top region having the first conductivity type and formed in the high-voltage well; and
        a grade region having the second conductivity type and formed above the top region.

2. The semiconductor device of claim 1, wherein the first metal portion and the third metal portion are connectable to receive a source voltage.

3. The semiconductor device of claim 1, wherein the second metal portion are connectable to receive a gate voltage.

4. The semiconductor device of claim 1, further including a drain region formed in the high-voltage well and spaced apart from the drift region.

5. The semiconductor device of claim 4, wherein the metal layer further includes a fourth metal portion overlapping and conductively contacting the drain region.

6. The semiconductor device of claim 5, wherein the fourth metal portion is connectable to receive a drain voltage.

7. The semiconductor device of claim 1, wherein the device is a lateral drain metal-oxide-semiconductor (LDMOS) device.

8. The semiconductor device of claim 1, wherein the device is an insulated-gate bipolar transistor (IGBT) device.

9. The semiconductor device of claim 1, wherein the first conductivity type is P-type and the second conductivity type is N-type.

10. The semiconductor device of claim 1, wherein the first conductivity type is N-type and the second conductivity type is P-type.

11. The semiconductor device of claim 1, further including a bulk well having the first conductivity type and formed outside of the high-voltage well.

12. The semiconductor device of claim 11, further including a bulk region formed in the bulk well.

13. The semiconductor device of claim 12, wherein the metal layer further includes a fourth metal portion overlapping and contacting the bulk region, the fourth metal portion being connectable to receive a bulk voltage.

14. A method for fabricating a semiconductor device, the method comprising:
    providing a substrate having a first conductivity type;
    forming a high-voltage well having a second conductivity type in the substrate;
    forming a source well having the first conductivity type in the high-voltage well;
    forming a source region in the source well;

forming an isolation layer above the high-voltage well and spaced apart from the source well;

forming a gate layer above the substrate and continuously extending from above an edge portion of the source well to an edge portion of the isolation layer;

forming a metal layer above the substrate and the isolation layer, the metal layer including a first metal portion overlapping an edge portion of the gate layer and a side portion of the isolation layer, a second metal portion overlapping and conductively contacting the gate layer, and third metal portion overlapping and conductively contacting the source region; and forming a drift region in the high-voltage well and under the isolation layer, wherein the forming the drift region includes:
  forming a top region having the first conductivity type in the high-voltage well; and
  forming a grade region having the second conductivity type above the top region.

15. The method of claim 14, wherein the first conductivity type is P-type and the second conductivity type is N-type.

16. The method of claim 14, wherein the first conductivity type is N-type and the second conductivity type is P-type.

* * * * *